United States Patent
Lang et al.

(10) Patent No.: US 6,709,715 B1
(45) Date of Patent: Mar. 23, 2004

(54) PLASMA ENHANCED CHEMICAL VAPOR DEPOSITION OF COPOLYMER OF PARYLENE N AND COMONOMERS WITH VARIOUS DOUBLE BONDS

(75) Inventors: Chi-I Lang, Sunnyvale, CA (US); Shin-Puu Jeng, Hsinchu (TW); Yeming Jim Ma, Santa Clara, CA (US); Fong Chang, Los Gatos, CA (US); Peter Wai-Man Lee, San Jose, CA (US); David W. Cheung, Foster City, CA (US)

(73) Assignee: Applied Materials Inc., Santa Clara, CA (US)

( * ) Notice: Subject to any disclaimer, the term of this patent is extended or adjusted under 35 U.S.C. 154(b) by 445 days.

(21) Appl. No.: 09/336,368

(22) Filed: Jun. 17, 1999

(51) Int. Cl.$^7$ ............................... H05H 1/46; C08J 7/18
(52) U.S. Cl. ..................... 427/489; 427/578; 427/579; 427/563; 438/789; 438/788
(58) Field of Search ............................... 427/488, 489, 427/491, 523, 527, 535, 536, 537, 562, 563, 569, 574, 578, 579; 438/780, 781, 788, 789

(56) References Cited

U.S. PATENT DOCUMENTS

| | | | | |
|---|---|---|---|---|
| 3,663,265 A | * | 5/1972 | Lee et al. ................... | 427/490 |
| 3,900,600 A | * | 8/1975 | Spaulding ................... | 427/99 |
| 4,291,244 A | * | 9/1981 | Beach et al. | |
| 4,500,562 A | * | 2/1985 | Jahn et al. ................... | 427/488 |
| 4,951,601 A | | 8/1990 | Maydan et al. ............. | 118/719 |
| 5,137,780 A | * | 8/1992 | Nichols et al. ............. | 427/488 |
| 5,424,097 A | | 6/1995 | Olson et al. ............. | 427/255.5 |
| 5,534,068 A | | 7/1996 | Beach et al. ................ | 118/719 |
| 5,536,317 A | | 7/1996 | Crain et al. ................ | 118/664 |
| 5,536,321 A | | 7/1996 | Olsen et al. ................ | 118/719 |
| 5,536,322 A | | 7/1996 | Wary et al. ................. | 118/719 |
| 5,536,892 A | | 7/1996 | Dolbier, Jr. et al. ........ | 570/144 |
| 5,538,758 A | | 7/1996 | Beach et al. ............. | 427/255.6 |
| 5,556,473 A | | 9/1996 | Olson et al. ................ | 118/719 |
| 5,709,753 A | | 1/1998 | Olson et al. ................ | 118/719 |
| 5,958,510 A | * | 9/1999 | Sivaramakrishnam et al. ......................... | 427/488 |
| 6,022,595 A | * | 2/2000 | McDonald et al. ......... | 427/488 |
| 6,051,321 A | * | 4/2000 | Lee et al. .................... | 427/489 |
| 6,054,379 A | * | 4/2000 | Yau et al. ................... | 438/789 |
| 6,086,952 A | * | 7/2000 | Lang et al. ................. | 438/780 |
| 6,107,184 A | * | 8/2000 | Mandal et al. ............. | 438/781 |
| 6,130,171 A | * | 10/2000 | Gomi ......................... | 438/781 |
| 6,165,554 A | * | 12/2000 | Halpern et al. ............. | 427/488 |

OTHER PUBLICATIONS

Shin–Puu Jeng, Mi–Chang Chang, Tara Kroger, Peter McAnally, and Robert H. Havemann, "A Planarized Multi-level Interconnect Scheme With Embedded Low–Dielectric–Constant Polymers For Sub–quarter–Micron Applications" No Source of Publication & no date (but from reference cited there in 1993 or after).

Sybil P. Parker, Editor in Chief, "McGraw–Hill Dictionary of Chemistry," 1984, p. 450 no month.

(List continued on next page.)

*Primary Examiner*—Marianne Padgett
(74) *Attorney, Agent, or Firm*—Moser, Patterson & Sheridan

(57) ABSTRACT

A method and apparatus for depositing a low dielectric constant film by plasma assisted copolymerization of p-xylylene and a comonomer having carbon-carbon double bonds at a constant RF power level from about 0W to about 100W or a pulsed RF power level from about 20W to about 160W. The copolymer film has a dielectric constant from about 2.2 to about 2.5. Preferred comonomers include tetravinyltetramethylcyclotetrasiloxane, tetraallyloxysilane, and trivinylmethylsilane. The copolymer films include at least 1% by weight of the comonomer.

5 Claims, 8 Drawing Sheets

OTHER PUBLICATIONS

N. Irving Sax and Richard J. Lewis, Sr., "Hawley's Condensed Chemical Distionary," Eleventh Edition, 1987, p. 876 no month.

Ashok K. Sharma, "Parylene C at Subambient Temperatures," *Journal of Polymer Science:* Part A: Polymer Chemistry, vol. 26, 1988, pp. 2953–2971 no month.

* cited by examiner

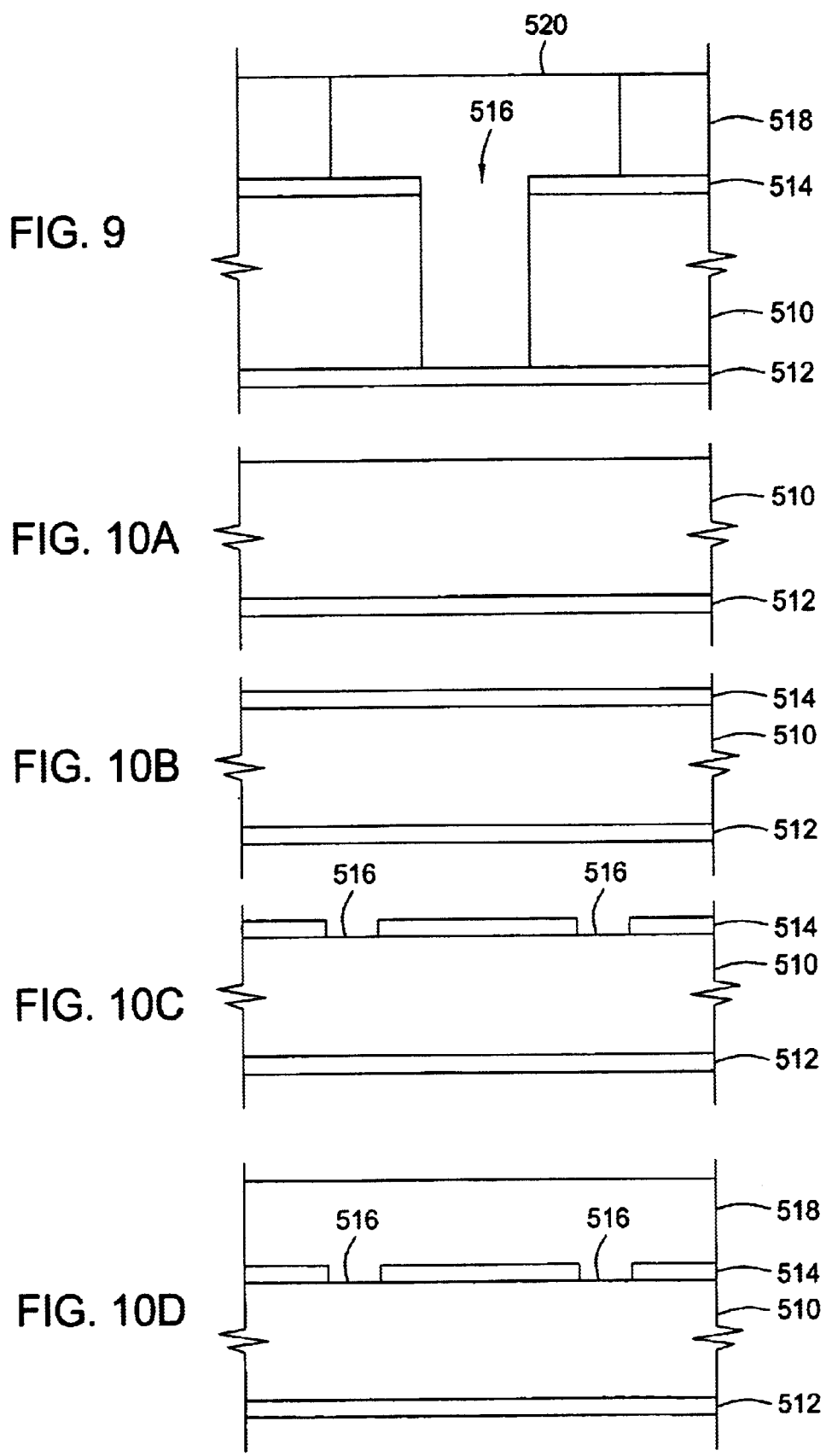

PLASMA ENHANCED CHEMICAL VAPOR DEPOSITION OF COPOLYMER OF PARYLENE N AND COMONOMERS WITH VARIOUS DOUBLE BONDS

BACKGROUND OF THE DISCLOSURE

1. Field of the Invention

The present invention relates to the fabrication of integrated circuits. More particularly, the invention relates to a process and apparatus for depositing dielectric layers on a substrate.

2. Background of the Invention

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 cm and even 0.18 $\mu$m feature sizes, and future plants will be producing devices having even smaller geometries. Jeng et al. in "A Planarized Multilevel Interconnect Scheme with Embedded Low-Dielectric-Constant Polymers for Sub-Quarter-Micron Applications", published in the Journal of Vacuum and Technology in June 1995, describes the use of a low dielectric constant polymeric material, such as parylene, as a substitute for silicon dioxide ($SiO_2$) between tightly spaced conductive lines or other strategically important areas of an integrated circuit structure. Parylene, a generic name for thermoplastic polymers and copolymers based on p-xylylene and substituted p-xylylene monomers, has been shown to possess suitable physical, chemical, electrical, and thermal properties for use in integrated circuits. Deposition of such polymers by vaporization and decomposition of a stable cyclic dimer, followed by deposition and polymerization of the resulting reactive monomer, is discussed by Ashok K. Sharma in "Parylene-C at Sub-ambient Temperatures", published in the Journal of Polymer Science: Part A: Polymer Chemistry, Vol. 26; at pages 2953–2971 (1988). Properties of such polymeric materials, including their low dielectric constants, are further discussed by R. Olson in "Xylylene Polymers", published in the Encyclopedia of Polymer Science and Engineering, Volume 17, Second Edition, at pages 990–1024 (1989).

Several parylene films have been developed for deposition within integrated circuits. Parylene-N is deposited from unsubstituted p-xylylene at substrate temperatures below about 70–90° C. The parylene-N films typically do not adhere well to silicon oxide and other semiconductor surfaces. Furthermore, parylene-N films typically have poor thermal stability at temperatures above about 400° C. Thermal stability of parylene films is improved by fluorinating or chlorinating the cyclic dimer of p-xylylene to make parylene-F films or parylene-C films. However, the substituted p-xylylene cyclic dimers are even more expensive than the unsubstituted cyclic dimer and are more difficult to process. Copolymers of p-xylylene and fluorinated or chlorinated monomers may also improve thermal stability. However, the fluorine or chlorine within the films can corrode metal electrical interconnects when an electrical bias is applied.

Parylene films can be deposited by thermal deposition methods or plasma assisted deposition methods. The mechanical properties of the deposited parylene films have not been improved by plasma assistance, and parylene films have remained inferior to other dielectric films for producing integrated circuits. Copolymer films produced from parylene-N and a comonomer have been investigated to improve mechanical properties of the deposited films. However, few copolymer films have been shown to contain sufficient amounts of the comonomer to influence the mechanical properties of the deposited film.

There remains a need for parylene films having low dielectric constants and good mechanical properties for use in sub-micron semiconductor devices.

SUMMARY OF THE INVENTION

The present invention provides a method and apparatus for depositing a low k dielectric layer from a source of p-xylylene and a comonomer having carbon-carbon double bonds. In particular, a method and apparatus is provided for plasma assisted production of parylene copolymer films having low dielectric constants and improved mechanical properties in comparison to parylene films. A suitable apparatus and method provides for plasma-energized formation of reactive p-xylylene and a reactive comonomer using from about 0 to about 100 W of constant high frequency RF power, or from about 20 to about 160 W of pulsed high frequency RF power. A parylene copolymer is then deposited on a substrate wherein the copolymer contains at least 1% by weight of the comonomer. The comonomers comprise one or more carbon-carbon double bonds. The multi-vinyl compounds may further comprise silicon-carbon bonds and silicon-oxygen bonds. Preferred comonomers comprise two or more carbon-carbon double bonds and include tetravinyltetramethylcyclotetrasiloxane, tetraallyloxysilane, and trivinylmethylsilane. The comonomer is preferably combined with the p-xylylene in an amount from about 1% by weight to about 15% by weight. Plasma assistance increases the deposition rate of the copolymer layer and increases the amount of comonomer that combines with the p-xylylene.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 9 is a cross sectional view showing a dual damascene structure comprising a parylene copolymer layer of the present invention; and FIGS. 10A–10H are cross sectional views showing one embodiment of a dual damascene deposition sequence of the present invention.

Figure 1:
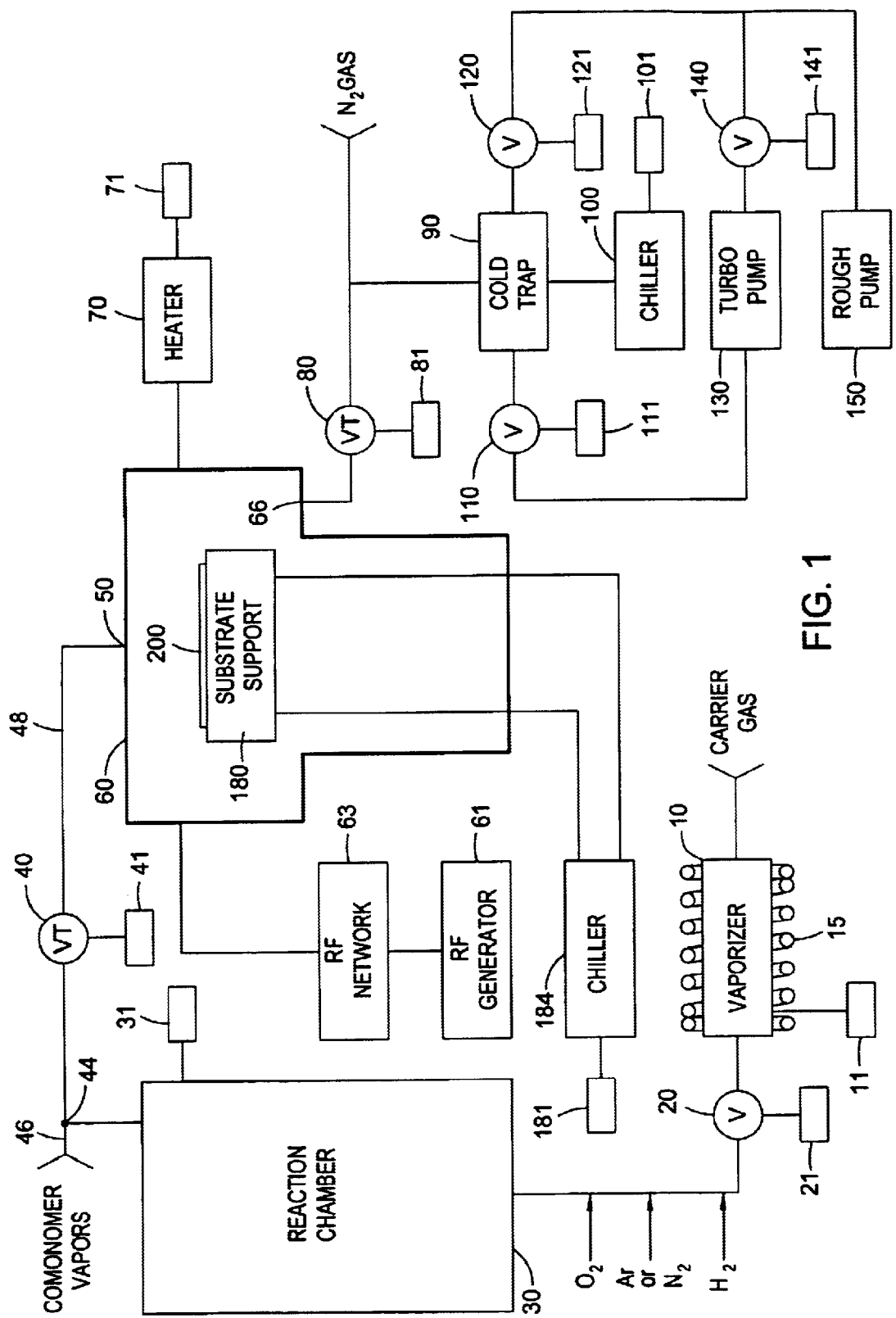
FIG. 1 is a schematic diagram of a vapor deposition apparatus suitable for the present invention.

For a further understanding of the present invention, reference should be made to the ensuing detailed description.

DESCRIPTION OF A PREFERRED EMBODIMENT

The present invention generally relates to a method and apparatus for forming thin polymer films having a low dielectric constant on the surface of a substrate. A processing chamber provides condensation of two or more monomer vapors onto a substrate and formation of a copolymer film. The copolymer film is produced from p-xylylene, or a derivative thereof, in combination with one or more comonomers. The p-xylylene or its derivative is formed in situ by decomposition of a p-xylylene precursor in a reactor or in the deposition chamber as described below. The comonomer can be introduced either after or during production of the p-xylylene precursor. Suitable comonomers include one or more carbon-carbon double bonds and may have silicon-carbon bonds and silicon-oxygen bonds.

Commercially available comonomers include 1,4-cyclohexadiene, 1,4-cycloheptadiene, 1,5-cyclooctadiene, p-divinylbenzene, 1,3,5-trivinylbenzene, 1,3-divinyl-(5-(triethoxysilyl)methyl)benzene, 1-vinyl-4-epoxybenzene, tetravinylsilane, trivinylmethylsilane, diphenyldiallylsilane, 1,3,5-trimethyl-1,3,5-trivinylcyclotrisilazane, divinylsiloxane, trivinylsiloxane, tetravinylsiloxane, tetraallyloxysilane, tetravinyl-tetramethylcyclotetrasiloxane tris(vinyldimethylsiloxy)-methylsilane, 1,1,3,3-tetravinyl-dimethyldisiloxane, 1,3-divinyl-tetramethyldisiloxane, 1,3-divinyl-1,3-dimethyl-diphenyldisiloxane, vinyltriisopropenoxy-silane, and 1,3-divinyl-5-triethoxysilyl-benzene. Comonomers having two or more carbon-carbon double bonds and Si—O bonds are preferred. The most preferred comonomers are tetravinyltetramethylcyclo-tetrasiloxane, tetraallyloxysilane, and trivinylmethylsilane The present invention includes decomposition of a p-xylylene precursor with minimum formation of side reaction products wherein the process is catalytic, pyrolytic, combined catalytic/pyrolytic, or plasma-discharge activated dissociation. In one embodiment, an apparatus and method is provided for vaporization of the cyclic dimer of p-xylylene. Another embodiment provides for the dehydrogenation of p-xylene or its derivatives on a platinum or palladium surface having a temperature between about 400 and about 900° C. with a residence time between about 1 and 100 milliseconds. The p-xylylene and the comonomer are then condensed onto a substrate in a vapor deposition chamber to form a parylene copolymer layer having a thickness from about 0.05 micron to 10 microns. It is preferred that the polymer have a dielectric constant lower than silicon dioxide as well as suitable physical, chemical, electrical and thermal properties for use on integrated circuits in accordance with the present invention.

In another embodiment, an apparatus and method is provided for the pyrolytic, or pyrolytic/ catalytic, decomposition of 1,4-bis(formatomethyl)benzene (O=CH—O—CH$_2$C$_6$H$_4$CH$_2$—O—CH=O) or 1,4-bis(N-methylamino-methyl)benzene (CH$_3$NH—CH$_2$C$_6$H$_4$CH$_2$NH—CH$_3$), optionally on a platinum, palladium, or nickel surface, in a decomposition chamber having a temperature between about 400° C. and about 900° C. with a residence time between about 1 and 100 milliseconds. In this embodiment, decomposition can occur by pyrolytic or catalytic processes in a tube reactor operated as described for dehydrogenation of p-xylene to form p-xylylene that exits the tube. The p-xylylene and an optional comonomer are then condensed onto a substrate in a vapor deposition chamber to form a parylene polymer layer.

In another embodiment, an apparatus and method is provided for the dehydrogenation of p-xylene in a plasma energized dehydrogenation reactor using high frequency RF power to form p-xylylene. The RF power can be from about 10 W to about 1000 W of constant RF power, or from about 20 W to about 2000 W of pulsed RF power at room temperature.

Deposition of p-xylylene, or its derivatives, and a comonomer is plasma assisted in a deposition chamber using from about 0 W to about 100 W of constant high frequency RF power, or from about 20 W to about 160 W of pulsed RF power. An apparatus used to deposit the copolymer film specifically includes a deposition chamber for depositing a thin polymer layer on an object as described below. A suitable deposition chamber is the DLK chamber available from Applied Materials, Inc. of Santa Clara, Calif. The copolymer process is preferably incorporated into a computer controlled multi-chamber integrated processing system such as the Centura™ processing system available from Applied Materials, Inc., of Santa Clara, Calif. The deposition process may also be performed in chambers that contain multiple substrates such as the chambers described in U.S. Pat. Nos. 5,838,121, 5,844,195, and 5,855,681, which chamber descriptions are incorporated by reference herein. Chambers that include multiple substrates preferably have separate process regions for each substrate and share common gas sources and exhaust systems.

As used herein, the term "parylene" is the generic name for thermoplastic polymers or copolymers based on p-xylylene ($CH_2=C_6H_4=CH_2$) or derivatives of p-xylylene. The p-xylylene polymers typically have the formula:

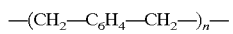

$$-(CH_2-C_6H_4-CH_2-)_n-$$

wherein n is the average number of monomer units in a molecule. Although not directly measured, n has been estimated to average about 5,000 in a typical parylene-N film, which gives the parylene-N film an estimated number average molecular weight of about 500,000. Actual molecular weights are expected to have a broad distribution and the actual molecular weights are considered to be non-measurable. The polymer grows by addition of monomer on both ends of a p-xylylene initiator and the parylene molecules have end groups which are not easily identified. It is believed that the end groups have no influence on properties. The term "parylene" also includes chlorinated or fluorinated forms of the parylene polymers produced by halogenating the monomers or the polymers.

The typical starting material for making parylene polymers is a stable cyclic dimer, di-p-xylylene, or halogenated derivative, which is available in solid form. The dimer is typically vaporized or sublimed at a temperature between about 100° C. and about 200° C., and then decomposed to the reactive monomer at a temperature between about 600° C. and about 1000° C. for the polymerization to proceed. The dimer is commercially available from companies such as Specialty Coating, Inc. Usually the solid dimer is available in particulate form, e.g., in powder form, for ease of handling. The dimer can be used in conjunction with a packed bed or may be liquefied or dissolved in a carrier fluid to facilitate continuous delivery of the dimer.

The present invention includes making p-xylylene or its derivatives in situ by dehydrogenation of p-xylene or its derivatives, or by thermal decomposition of 1,4-bis (formatomethyl)benzene or 1,4-bis(N-methylaminomethyl) benzene, or derivatives thereof, under conditions sufficient to minimize formation of other reaction products.

Referring to FIG. 1, in one embodiment, a vaporizer 10 having a heating element 15 and a power source 11 is provided to heat and vaporize a solid or liquid p-xylylene precursor such as di-p-xylylene (solid), xylene (liquid) or a p-xylene derivative. Preferred vaporizers for the liquid precursors employ liquid injection systems such as the AMAT Gas Precision Liquid Injection System (GPLIS) and the AMAT Extended Precision Liquid Injection System (EPLIS), both available from Applied Materials, Inc. The liquid injection systems vaporize precise amounts of a liquid component to provide a continuous feed of vaporized p-xylylene precursor. A carrier gas such as helium can also be used to control the residence time of the precursor in the vaporizer. An external heat controller 11, such as a Watlow 965 Temperature Controller, may be used.

The vaporized precursor, or optional mixture of vaporized precursor and a carrier gas, then passes from vaporizer 10 through a gate valve 20 to a reaction chamber 30 where the vaporized p-xylylene precursor is substantially dissociated to form a reactive monomer, such as p-xylylene. An additional source of a carrier gas such as argon or nitrogen is provided prior to the reaction chamber 30 to control the flow rate of the precursor. Also, sources of oxygen and hydrogen are provided for microwave cleaning and conditioning of the reaction chamber.

The pressure in vaporizer 10 may be maintained at atmospheric pressure. However, the entire apparatus (vaporization 10, reaction chamber 30, and deposition chamber 60) is referably maintained at a pressure from about 30 milliTorr to about 1 Torr. The increase in total pressure up to 1 Torr increases the deposition rate of the polymers and allows better control of the amount of monomer or polymer that is provided to the deposition chamber. The carrier gas can be any inert gas, preferably helium, argon, or nitrogen, most preferably helium.

The temperature of vaporizer 10, when operated within the previously described pressure ranges, will usually vary from a minimum temperature below which the solid or liquid precursor will not vaporize, at the vaporizer pressure, up to a maximum temperature below the temperature at which the vaporized material will dissociate at the vaporizer pressure. While the operating temperature of the vaporizer will vary according to the precursor material to be vaporized, the temperature is preferably maintained between about 100° C. and about 200° C.

Figure 4:
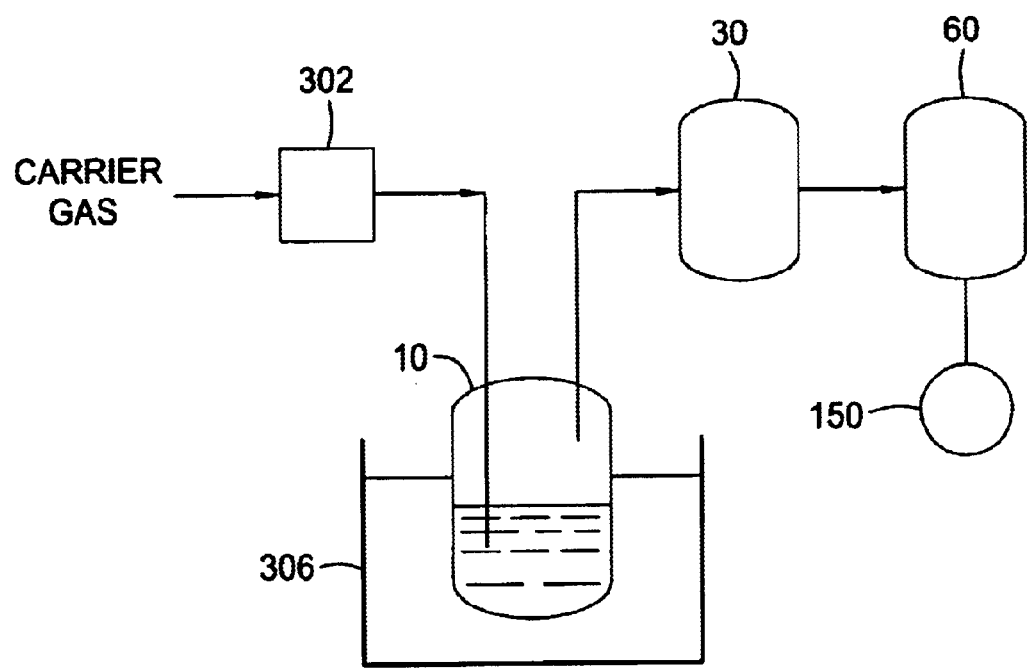
FIG. 4 is a schematic view of a carrier gas delivery system for providing a liquid comonomer to a deposition chamber.

An alternative embodiment for the vaporizer 10 is shown in FIG. 4 wherein a thermostatic oven 306 heats the vaporizer 10 which contains, for example, non-vaporized precursor and vaporized precursor. The carrier gas is passed through a flow controller 302 such as a metering pump or a needle valve and is bubbled through the non-vaporized precursor in the vaporizer 10. The combined carrier gas and vaporized precursor are then passed to the reaction chamber 30 and a deposition chamber 60 by a rough pump 150. A mass flow meter (not shown) can be placed anywhere between the vaporizer 10 and the deposition chamber 60 to measure the total mass leaving the vaporizer 10. The flow rate of precursor can then be calculated by subtracting the mass of carrier gas sent to the vaporizer 10.

Figure 2:
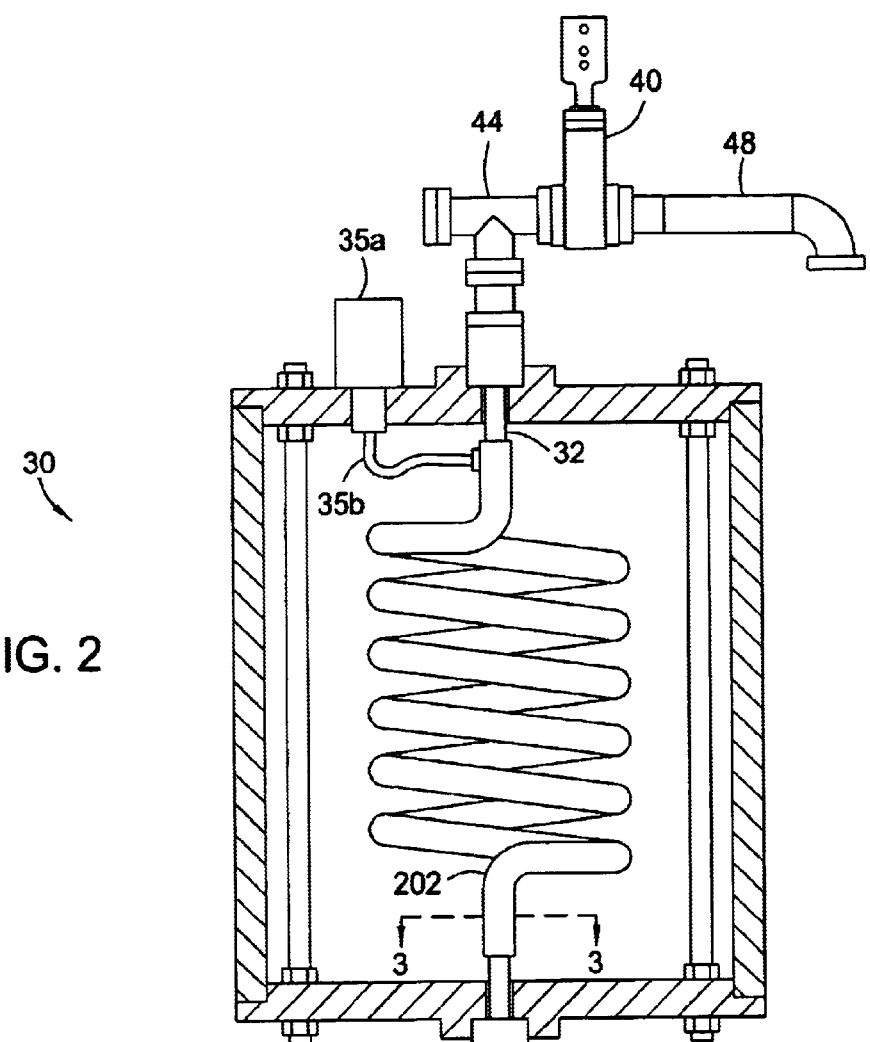
FIG. 2 is a partially sectioned view of an alternative portion of the apparatus of FIG. 1, showing a reactor for dehydrogenation of p-xylene.

Referring to FIGS. 1 and 2, a first valve 20 following the vaporizer 10 may be manually operated, but preferably will be automatically operated and connected to a valve controller 21 which will sense the temperature and pressure in vaporization chamber 10 and open valve 20 only after vaporization chamber 10 has reached a temperature at which the polymerizable material will vaporize so that gases flowing from vaporization chamber 10 through the first valve 20 will contain vaporized polymerizable material, as well as the optional non-reactive carrier gases flowing through vaporization chamber 10.

A metal conduit 26 connecting the vaporizer 10 to the reaction chamber 30 is preferably heated by an external heater such as heating tape wrapped around conduit 26 to maintain the precursor at a temperature sufficiently high so that it will not begin to condense. Typically, this will be a temperature of at least about 120° C.

The p-xylylene precursor is dissociated in the reaction chamber 30 as described below for several embodiments. The gas/vapor flow containing p-xylylene or a derivative thereof then passes out of the reaction chamber 30 to a tee 44 where the xylylene vapors are optionally blended with a comonomer in vaporized form from conduit 46 (shown in FIG. 1). A solid or liquid comonomer of the present invention is readily vaporized using the vaporizer described for the p-xylylene precursor. The vaporized p-xylylene and the comonomer then flow through a second gate valve 40 to a conduit 48 which connects valve 40 with an entrance port 50 to a substrate processing chamber 60. The monomers condense and copolymerize on an object therein, such as a semiconductor substrate, which is preferably temperature controlled by a support member 180 that is connected to a chiller 184. Condensation of the monomers typically occurs at a temperature from about −30° C. to about 50° C.

It is preferred that the walls of deposition chamber 60 be maintained at a sufficiently high temperature to prevent deposition and polymerization of the vaporized polymerizable material. In one embodiment, the chamber wall temperature is maintained by a heater 70, under the control of heater controller 71. The remaining gas/vapor mixture then passes from the deposition chamber 60 through a throttle valve 80, under the control of valve controller 81, which regulates the pressure in chamber 60, and then passes through a cold trap 90 connected to a chiller 100. The remaining gases then pass through a gate valve 120, controlled by valve controller 121, to a rough pump 150. It is anticipated that the chamber walls may be heated by any other heating means, including the use of a plasma which can be generated within the chamber itself.

In one embodiment, the deposition chamber 60 is provided with an RF generator 61 which is coupled to chamber 60 through an RF network 63 to permit generation of a plasma within chamber 60. The plasma enhances the deposition by converting p-xylene and the comonomer to reactive species. The plasma may also provide sufficient heating of the chamber walls to prevent polymerization thereon and/or sufficient heating of the process gases to prevent polymerization in the gas phase. In addition, the RF generator enables integration of the chamber so that either etching of the substrate or in situ cleaning of chamber 60 can be performed.

The RF generator 61 can supply either single or mixed frequency RF power to enhance the decomposition of reactive species introduced into the deposition chamber 60. A mixed frequency RF power supply typically supplies power at a high RF frequency (RFI) of 13.56 MHz to a gas distribution manifold and at a low RF frequency (RF2) of 360 KHz to a substrate holder. The silicon oxide layers of the present invention are most preferably produced using low levels of constant high frequency RF power or pulsed levels of high frequency RF power. Pulsed RF power preferably provides 13.56 MHz RF power at about 20W to about 160W, most preferably from 20W to about 100W, during about 10% to about 30% of the duty cycle. Constant RF power preferably provides 13.56 MHz RF power at about 0W to about 100W, preferably from about 10W to about 80W. Low power deposition preferably occurs at a temperature range from about −20° C. to about 40° C. At the preferred temperature range, the deposited film is filly polymerized or is partially polymerized during deposition and polymerization is completed during subsequent curing of the film.

It is contemplated that the chamber may include an electric bias to provide an electric field to enhance the deposition rate of the polymerizable material onto the substrate. Preferably, the chamber walls are grounded and a DC bias is applied to the substrate support member 180. In addition to the electric field, a B field may be created in the chamber by placement of magnetic field coils or permanent magnets within or about the walls of the chamber. It is also believed that both the E field and the B field enhance the deposition rate of the polymerizable material onto the substrate because the reactive polymerizable material may be polarized. It is theorized that the E field and/or the B field assist in the polymerization process by aligning the reactive material so that the polymerization reaction is facilitated.

It should be noted that, in accordance with the invention, the substrate 200 is preferably processed in a closed system. Thus, after the deposition, the substrate may be removed from the deposition chamber 60, placed in a storage area in a load lock chamber between processing chambers, and allowed to reach ambient temperature. This permits the substrate to reach ambient temperature without either exposing the substrate to the ambient atmosphere during the warm-up (which would result in unacceptable moisture pickup), or leaving the coated substrate in the deposition chamber to warm up (which would reduce the throughput rate in the parylene deposition chamber). Alternatively, the substrate may be moved from the load lock chamber to other chambers for subsequent processing without removing the substrate from the vacuum environment, e.g., moved to another chamber for PECVD formation of a silicon dioxide ($SiO_2$) film thereon.

Figure 3:
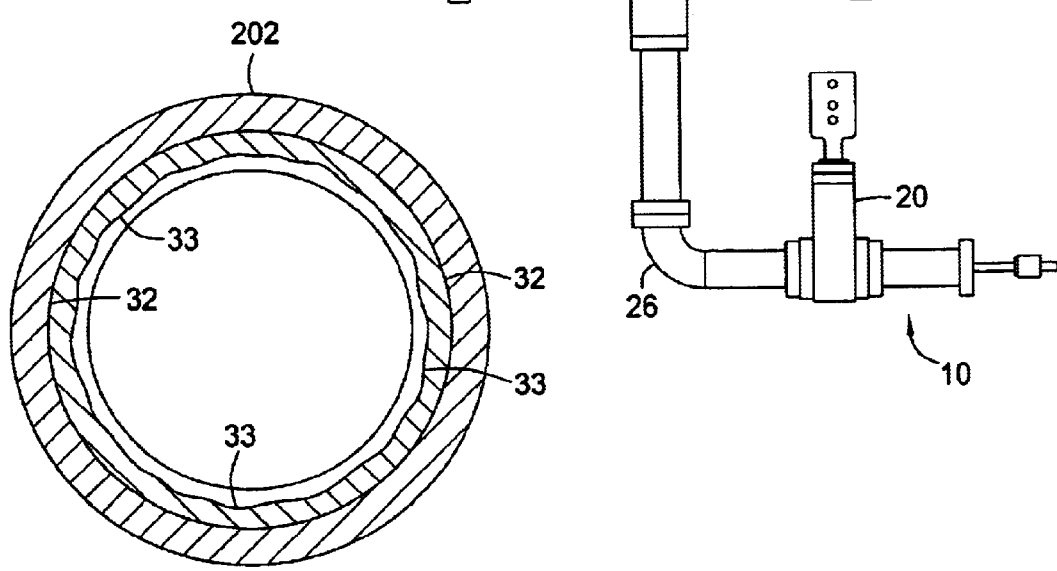
FIG. 3 is a horizontal cross-sectional view of a the dehydrogenation reactor tube shown in FIG. 2.

A preferred reaction chamber 30 for preparing reactive p-xylene or a reactive comonomer is shown in FIGS. 2 and 3. While a dehydrogenation or pyrolytic decomposition reactor may be constructed in many ways, it is preferred that the reactor have a large surface area to heat the vaporized material rapidly and evenly and a short residence time to minimize formation of dimers. In FIG. 2, the reaction chamber 30 comprises a helical tube 32 that is connected, via conduit 26, to the first gate valve 20. The helical tube 32 has a platinum or palladium inner surface 33 for dehydrogenation of p-xylene, or derivatives thereof, and can be constructed from either metal. Catalytic metals can also be used for pyrolytic dissociation. The inner surface 33 is preferably roughened to increase contact with the p-xylylene precursor as shown in FIG. 3. Alternatively, the reaction chamber 30 can be constructed by electroplating the inner surface of a nickel or molybdenum tube (e.g., 0.5 inch OD, 6 ft. length) with platinum or palladium, followed by winding the tube into a helical configuration.

Surrounding the helical tube 32 is a heating tape 202, or ceramic heating furnace with an inner cavity, having heater wires embedded therein, to heat the helical tube 32. The heater wires of the heating tape 202 or ceramic furnace are connected to an external power supply 35a by a wire 35b, to a temperature controller 31, and to computer control means 340 to maintain a temperature between about 400° C. and about 900° C., preferably about 650° C. A temperature above 500° C. and preferably above about 600° C., is necessary to assure sufficient dehydrogenation of the xylene, while minimizing dimer formation.

Figure 5:
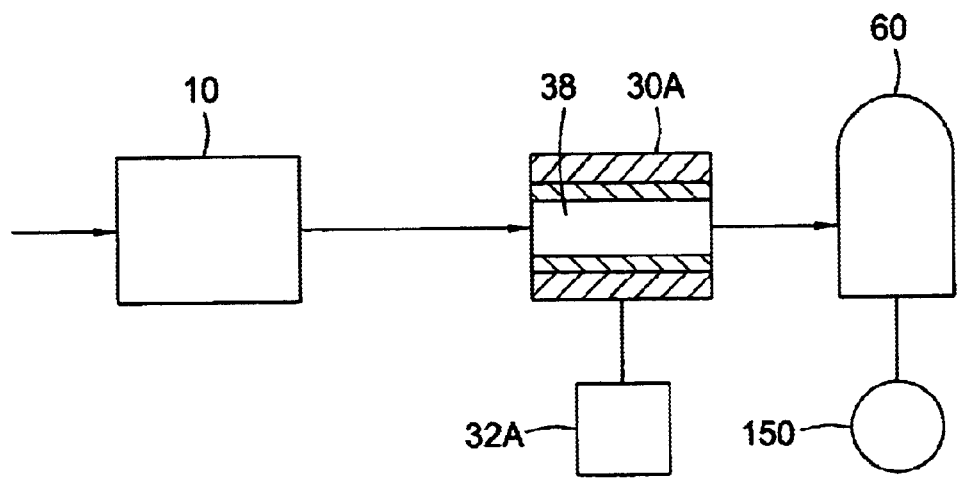
FIG. 5 is a cross-sectional view of an alternate portion of the apparatus of FIG. 1, showing a microwave chamber for preparation of reactive monomers.

Referring now to FIG. 5, an alternative reaction chamber 30A employs a microwave applicator 32A that couples RF power to a p-xylylene precursor such as di-p-xylylene or p-xylene. The precursor passes through an RF transparent tube 38, e.g. $Al_2O_3$ or $SiO_2$, enclosed within a microwave cavity 38A. RF energy is fed to the microwave cavity and a plasma discharge forms in the tube 38. The RF power source preferably provides high frequency RF power (e.g. about 13 to about 14 MHz) to input from about 10W to about 1000W of constant RF power or about 20W to about 2000W of pulsed RF power to the vaporized precursor introduced into chamber 30 prior to entering the deposition chamber.

It is preferred that the reaction chamber 30 provide a residence time of about 1 to about 100 milliseconds to avoid excessive decomposition. After deposition, the reaction chamber is preferably swept with nitrogen, argon, or helium to prevent excessive precursor residence time within the reaction chamber 30. Periodically, between film depositions, the reaction chamber can be treated with flowing oxygen to remove any coking deposits.

It should be noted that the use of first gate valve 20 and second gate valve 40, both preferably computer controlled, allows both the vaporizer 10 and the reaction chamber 30 to be isolated from deposition chamber 60 while the substrate is removed from the deposition chamber. That is, the whole system need not be shut down during movement of a substrate into the deposition chamber to be coated, or out of the deposition chamber after the deposition. The operation of the entire system, including the heater power sources 11, 31, valve controllers 21, 41, 81, 111, 121, 141, heater controller 71, and chiller controllers 101, 181, is preferably controlled by computer control means 340.

The residence time of the p-xylylene precursors in the reaction chamber may be controlled by regulating the flow of carrier gas into vaporization chamber 10; by throttling gate valves 20 and 40; or by a changing the length of the tube 32, 37 in combination with the pressure within the reaction chamber 30 and the internal volume within the reaction chamber.

As further shown in FIGS. 1 and 2, the gases flowing from the reaction chamber 30 is combined at a tee 44 with other copolymerizable materials, i.e., monomers or dimers with which the reactive parylene monomers will react and polymerize in the deposition chamber, as will be described below. Preferably, the reactive monomers and comonomers are combined within a deposition chamber 60 as described for FIG. 6 below. A second gate valve 40, which is operated by valve controller 41 and computer control means 340 to control the flow of vapors into the deposition chamber 60, as will be described below.

The conduit between the reaction chamber and a deposition chamber 60 is preferably heated by an external heater such as heating tape to maintain the reactive monomer at a temperature sufficiently high so that it will not begin to polymerize. Usually this will comprise a temperature of at least about 150° C. When a copolymerizable source is used, a second vaporization chamber, similar to the previously described vaporization chamber 10, can be used to vaporize the copolymerizable material. The apparatus used to provide such a copolymerizable material in gaseous form may then be connected to the tee 44 or to the deposition chamber 60 as described below to thereby permit the respective gaseous reactive copolymerization sources to blend together prior to condensing on a substrate within the deposition chamber 60.

When a copolymer film is desired, the amount of comonomer blended with the gaseous flow of p-xylylene monomer and carrier gas may range up to about 25% by wt. of the total mixture of monomers, but preferably will range from about 1% by wt. to about 15% by wt. The typical amount of copolymerizable monomer added usually comprising at least 5% by wt. of the monomer mixture total.

The deposition chamber 60 is preferably configured for use on an integrated platform for processing integrated circuits. Such an integrated platform is described in Maydan et al., U.S. Pat. No. 4,951,601, the disclosure of which is hereby incorporated by reference. For parylene deposition, internal surfaces of the chamber 60 are maintained at a temperature above the polymerization temperature of the reactive parylene monomer, i.e., at a temperature above about 100° C., but below a temperature at which further decomposition of the reactive monomer might occur, i.e., at a temperature below about 750° C. Typically, the temperature of the chamber 60 will be maintained within a range of from about 100° C. and about 300° C.

Figure 6:
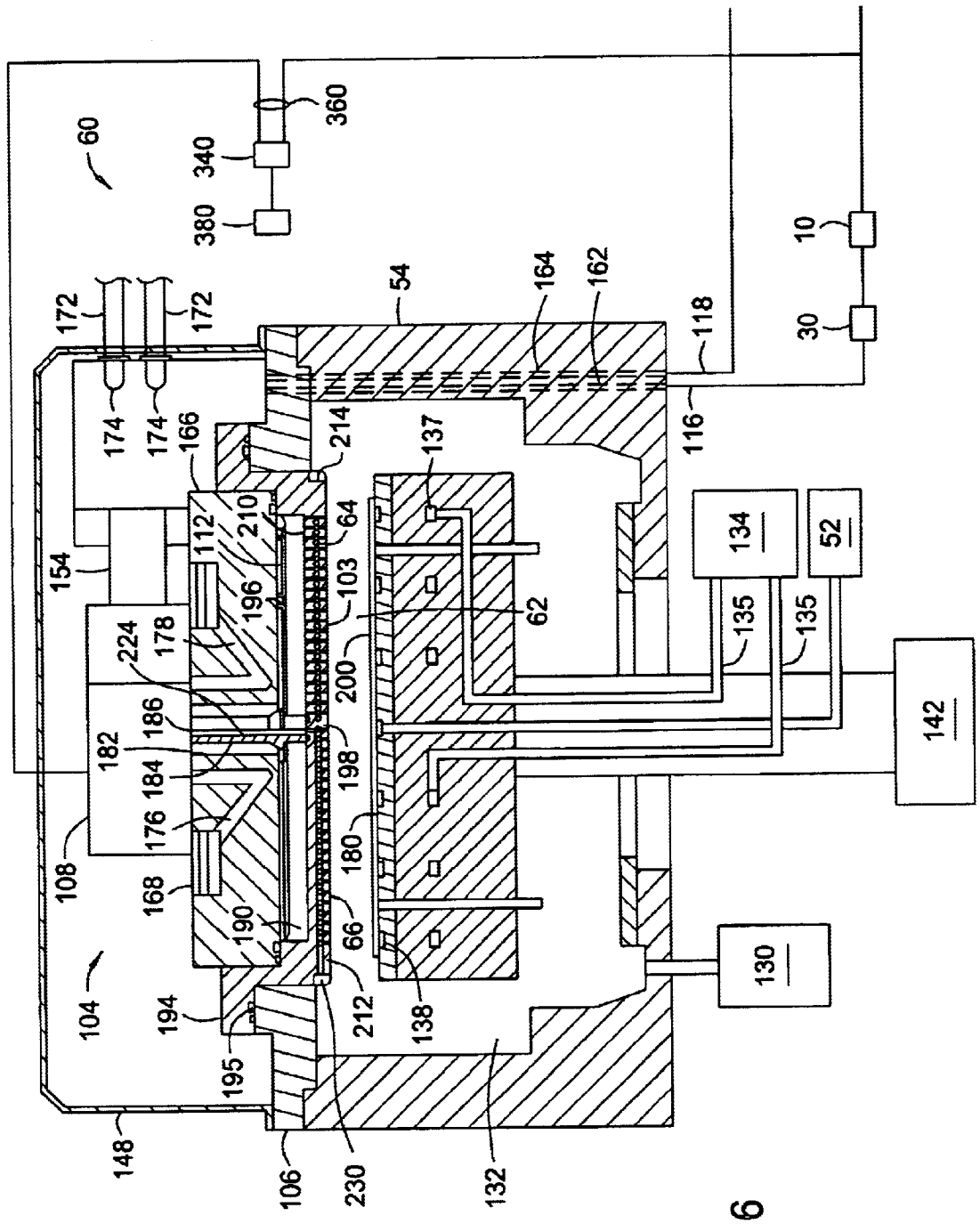
FIG. 6 is a cross-sectional diagram of an exemplary CVD processing chamber used according to one embodiment of the present invention.

FIG. 6 shows a cross sectional view of one embodiment of a processing chamber 60, incorporating the present invention. The chamber 60 generally includes a chamber body 54, enclosing a processing region 62, wherein chemical precursors are introduced during processing. A vertically movable temperature-controlled substrate support member 160 is disposed through a lower end of the chamber body 54 to support a substrate 200 thereon. The substrate support member 160 includes a cooling channel 137, through which a fluid is passed to effect heating and/or cooling of the support member 160. An annular vacuum exhaust channel 132, connected to a vacuum pump 130, is provided to expel process gases from the process region 62. A top gas distribution assembly 104 is disposed on a lid 106 to deliver gases into the chamber 60. The gas distribution assembly 104 comprises a gas feedthrough 108, a gas injection cover plate 170, a blocker plate 112, and a multi-channel faceplate 200. The faceplate 103 is shown incorporated into the chamber 60 as part of the gas distribution assembly 104, so that the faceplate 103 defines the upper limit of the processing region 62. The lid 106 mounts the faceplate 103 and supports the gas injection cover plate 170. O-rings 195, located in a flange 194, provide a seal between the flange 194 of the faceplate and the lid 106. A cover 148 is disposed over the lid 106. The faceplate 103, described in detail below, is preferably designed to separately deliver a first and a second precursor gas into the processing region 62 via gas channels.

The faceplate 103 includes a top surface 210, a bottom surface 212, and a peripheral annular portion, or sidewall 214. A first gas pathway includes a first set of vertical channels 64, which channels extend through the faceplate 103 to provide fluid communication between an upper region 190, adjacent the top surface 210, and lower region 235, adjacent the bottom surface 212, where an upper limit of the upper region 190 is defined by the gas injection cover plate 166, shown in FIG. 6. A second gas pathway includes a second set of vertical channels 66, which provide fluid communication between horizontal channels and the processing region 62. A central gas inlet, or nozzle 224, disposed perpendicularly through the top surface 210 is in fluid communication with the horizontal channels and is received by a lower portion of a conduit 184, shown in FIG. 6. An annular ring 230, adapted to fit circumferentially abut the sidewall 214, hermetically seals the endpoints of the set of horizontal channels 222. To help ensure an airtight seal, the ring 230 and the sidewall 214 may be fused together. Alternatively, the endpoints of the horizontal channels 222 may be individually plugged.

The faceplate 103 is preferably monolithic, i.e., machined or otherwise fabricated as a single piece of material, where the size and spacing of the holes may be varied according to the particular application, so that uniform delivery into the process chamber is achieved. Manufacturing the faceplate as a single piece of material avoids the problems encountered with aligning separate plates and preventing leakage of gases between plates and into separate channels.

The gas feedthrough 108, mounts the gas injection plate 166 and comprises an inlet manifold 150, an outlet manifold 152, and a housing 154 interposed therebetween. Gas delivery tubes extend through the housing 154 to separately route two process gases therethrough. The gas delivery channels are connected to a first monomer supply line 116 from the reaction chamber 30 and second monomer supply line 118, respectively, at the bottom of the chamber body 54.

The gas feedthrough 108 circulates a heat transfer fluid through an annular fluid passageway 180 formed in the gas injection cover plate 160 via coolant fluid inlet channel 176 and a coolant fluid outlet channel 178 that communicate with fluid lines 172 connected to fluid ports 174.

A central bore 182, disposed through the gas injection cover plate 160, houses a coaxially disposed gas conduit 184, which delivers a gas to second gas pathway 216, which includes the second set of horizontal channels 222. The conduit 184 channels a second gas into the nozzle 224 which is received at a lower end of the conduit 184. The central bore 182 and the perimeter of the conduit 184 define a gas delivery passage 186, which delivers a gas above the blocker plate 112 and into the first set of vertical channels. The perforated blocker plate 112, suspended by screws 196, is horizontally disposed within the upper region 190. The blocker plate 112 is perpendicularly intersected by the gas conduit 184, which traverses the upper region 190 and terminates near the top surface 210, so that the conduit 184 and the top surface 210 are in mating abutment and hermetically sealed by an O-ring 198.

FIG. 6 also shows a remote cooler 184 connected to the substrate support member 160 by coolant lines 135. A liquid coolant such as water, ethylene, glycol, or the like is delivered to the substrate support member 180, circulated through a spiraling cooling channel 137, and then circulated back to the cooler 184. The circulation of the fluid allows the temperature of the substrate support member 160 to be controlled by a chiller controller 181. To ensure a highly efficient heat exchange, the substrate support member 160 is preferably made of aluminum, because of its excellent thermal conductive properties as well as its resistance to the corrosive effects of the chemical precursors. FIG. 6 shows a plurality of grooves 138 formed in the substrate seating surface 180. The substrate is secured to the seating surface by conventional means (not shown) such as an electrostatic chuck or a clamp ring. A substrate backside purge with helium through a purge pump 52 prevents deposition within the grooves 138.

Generally, the process gases supply lines -for each of the process-gases include (i) safety shut-off valves (not shown) that can be used to automatically or manually shut-off the flow of process gas into the chamber, and (ii) mass flow controllers (also not shown) that measure the flow of gas through the gas supply lines. When toxic gases are used in the process, the several safety shut-off valves are positioned on each gas supply line in conventional configurations.

In operation, the substrate 200 is positioned onto the substrate support member 160 by a an external robot (not shown). A first gas is then routed through the first vertical passages 64, while the second gas is routed through the second vertical passages 66. The first gas is delivered into the upper region 190, above the blocker plate 112. The blocker plate 112 acts as an initial dispersion stage, forcing the first gas to pervade upper region 190 and diffuse over the upper surface of the blocker plate 112. The first gas then migrates through perforations in the blocker plate 112, uniformly impinges on the top surface 210, and ultimately migrates through the first and second vertical channels 64, 66.

Where the desired polymer is to be formed on the substrate 200 such as parylene, the substrate support 160 should be maintained at a temperature below the condensation temperature of the monomer, e.g. for p-xylylene the substrate support 160 should not exceed about 50° C., and preferably within a range of from about −30° C. to about +50° C., using chiller 184, under control of chiller controller 181. When the gaseous mixture contacts the cooled surface of, for example, semiconductor substrate 200, polymerization of the reactive p-xylylene monomers commences, as well as copolymerization with other reactive polymerizable materials (if present) resulting in the formation of the desired dielectric film of parylene or parylene copolymer on the surface of the substrate, e.g., on the surface of semiconductor substrate 200.

Referring to FIG. 1, to prevent deposition of parylene films on the chamber walls, the heater 70 preferably provides a heat exchange fluid, such as a 1:1 mixture by weight of ethylene glycol and deionized water, through passages (not shown) in the chamber sidewalls.

Referring to FIG. 6, the deposition process performed in chamber 60 can be either a thermal process or plasma enhanced process. In a plasma process, a controlled plasma is formed adjacent to the wafer by RF energy applied to distribution manifold 108 from RF power supply 61 (with substrate support member 160 grounded). Faceplate 103 is also an RF electrode, while substrate support member 160 is grounded. RF power supply 61 can supply either single or mixed frequency RF power to manifold 108 to enhance the decomposition of reactive species introduced into chamber 60. A mixed frequency RF power supply typically supplies power at a high RF frequency (RF1) of 13.56 MHz. And at a low RF frequency (RF2) of 360 KHz. Application of RF power to the processing chamber 60 can be used to dehydrogenate the p-xylylene precursor as previously mentioned.

Typically, any or all of the chamber lining, gas inlet manifold faceplate, and various other reactor hardware is made out of material such as aluminum or anodized aluminum. An example of such a CVD apparatus is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al, and assigned to Applied Materials, Inc., the assignee of the present invention. The disclosure of the '113 patent is incorporated by reference.

Gas flows and RF power supply 61 are controlled by the computer control means 340 over control lines 360. The chamber includes analog assemblies such as mass flow controllers (MFCs) and RF generators that are controlled by the control means 340 which executes system control software stored in a memory 380, preferably a hard disk drive.

Now referring to FIG. 1, after the mixture of vaporized monomers and optional carrier gases flow into chamber 60, a parylene copolymer, for example, is deposited on the surface of substrate 200 by condensation and polymerization of the reactive p-xylylene monomers and a comonomer comprising various carbon-carbon double bonds. The monomers polymerize on the surface of the substrate at different rates depending on the relative concentrations and relative polymerization reaction rates of the monomers. The remainder of the optional carrier gases, and any remaining unreacted monomer vapors, then pass out of chamber 60 (see FIG. 7) and then through a throttle valve 80 to a cold trap 90. The purpose of throttle valve 80 is to maintain the desired pressure within chamber 60. The deposition/polymerization reaction is usually carried out while maintaining a pressure within deposition chamber 60 of from about 30 milliTorr to about 0.5 Torr. When the monomer is p-xylylene, the pressure in the chamber 60 is maintained between 30 mTorr and 1 Torr-since a pressure above about 1 Torr will result in deposition of an amorphous film to a lower crystallinity film. When the pressure in deposition chamber 60 deviates from the set pressure, throttle valve 80, which is connected to a pressure sensor, either opens to cause the pressure to drop, or closes to cause the pressure to rise.

Figure 7:
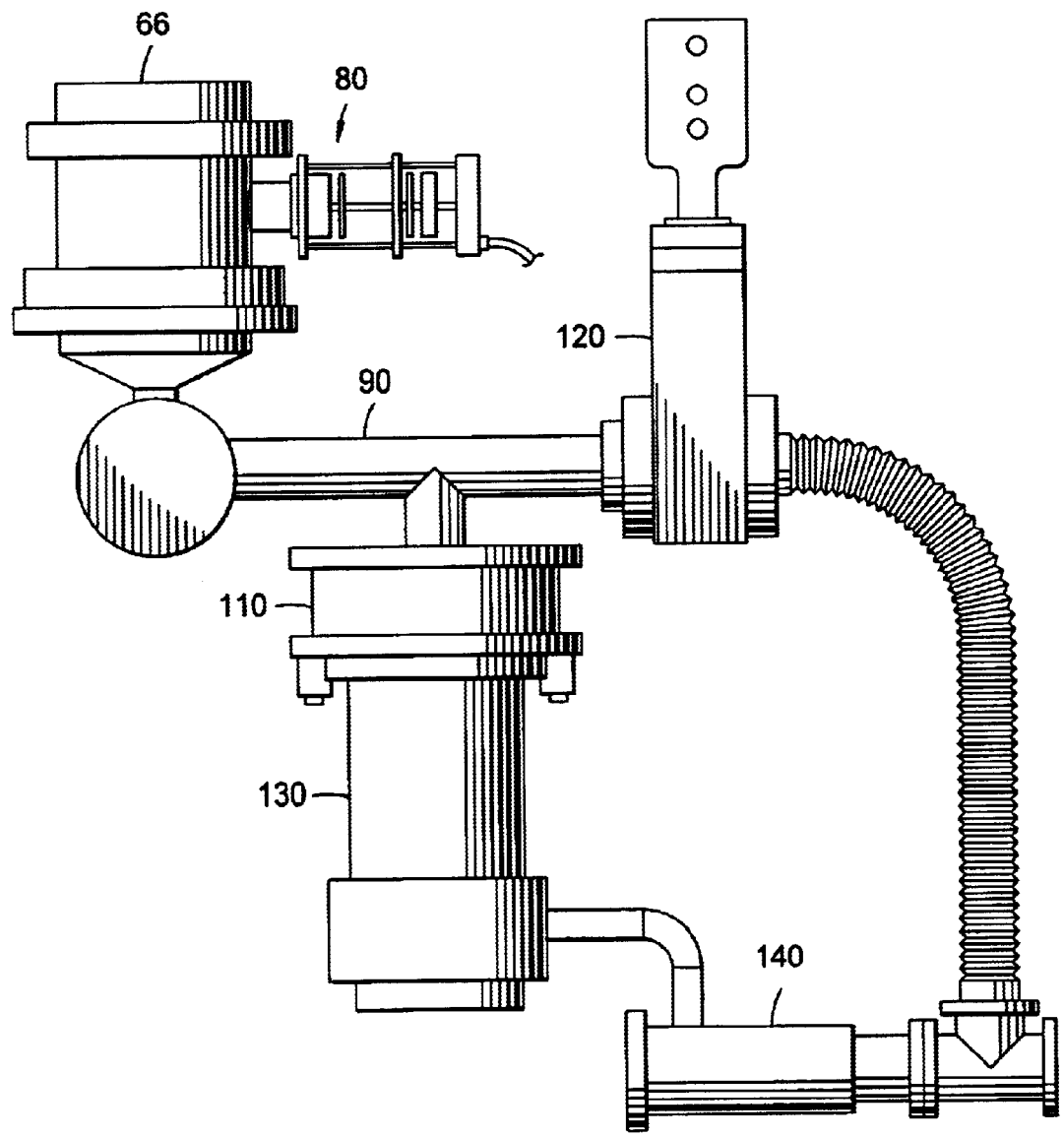
FIG. 7 is a cross-sectional view of a portion of the apparatus generally shown in FIG. 1, showing the processing of gases/vapors exiting from the processing chamber.

Now referring to FIG. 7, throttle valve 80 may be modified, if desired, to permit a non-reactive gas, e.g., argon, helium, or nitrogen, to be added to the gaseous stream flowing from chamber 60 through throttle valve 80 to cold trap 90. Typically, this additional gas flow into cold trap 90 will comprise a flow of about 50 standard cubic centimeters per minute (sccm), depending on the chamber volume under the control of controller 340. The purpose of the added non-reactive gases is to enhance plasma uniformity which improves the properties of the deposited films.

The vapors and gases passing through throttle valve 80 then enter cold trap 90 which, in turn, is connected to a vacuum pump 150 (see FIG. 1) which is capable of maintaining chamber 60 at subatmospheric pressure. It is important, however, that unreacted monomer and other copolymerizable materials not enter vacuum pump 150, but rather be removed from the gas stream in cold trap 90. Cold trap 90 may comprise any conventional commercial cold trap, such as, for example, a standard Norcal cold trap, which is connected to the downstream side of throttle valve 80 to trap and remove any monomers or polymers from the gas stream.

Connected to the downstream side of cold trap 90 is gate valve 120 through which the remaining gases in the gas stream pass to rough vacuum pump 150 to maintain the desired low pressure. As shown in FIGS. 1 and 10, cold trap 90 is also connected through gate valve 110 to a turbo pump 130 and then through an isolation valve 140 to rough vacuum pump 150. When chamber 60 is used as a deposition chamber, such as for the previously discussed polymeric deposition of reactive p-xylylene monomer, valves 110 and 140 are shut and valve 120 is opened to connect rough vacuum pump directly to cold trap 90. However, if the same chamber is to be used as a plasma etch chamber or for any other processing requiring high vacuum, such as for in situ plasma cleaning of the chamber, as previously discussed, gate valve 120 may be shut off and both gate valve 110 and isolation valve 140 opened to place high vacuum turbo pump 130 in the stream between cold trap 90 and rough vacuum pump 150.

To clean the processing chamber 60 following deposition of reactive monomer, oxygen and $NF_3$ are introduced into the chamber from a microwave chamber, such as shown in FIG. 5, at a combined rate of 100–1000 sccm. The microwave chamber dissociates the cleaning gases to effectuate cleaning of the processing chamber 60.

Referring to FIG. 6, the computer controller 340 controls all of the activities of the CVD chamber and a preferred embodiment of the controller 340 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

The controller 340 operates under the control of a computer program stored on the hard disk drive 380. The computer program dictates the timing, mixture of gases, RF power levels, substrate support member, and other parameters of a particular process. The interface between a user and the system controller is typically via a CRT monitor and light pen.

The process can be implemented using a computer program product 400 that runs on, for example, the computer controller 340. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 8:
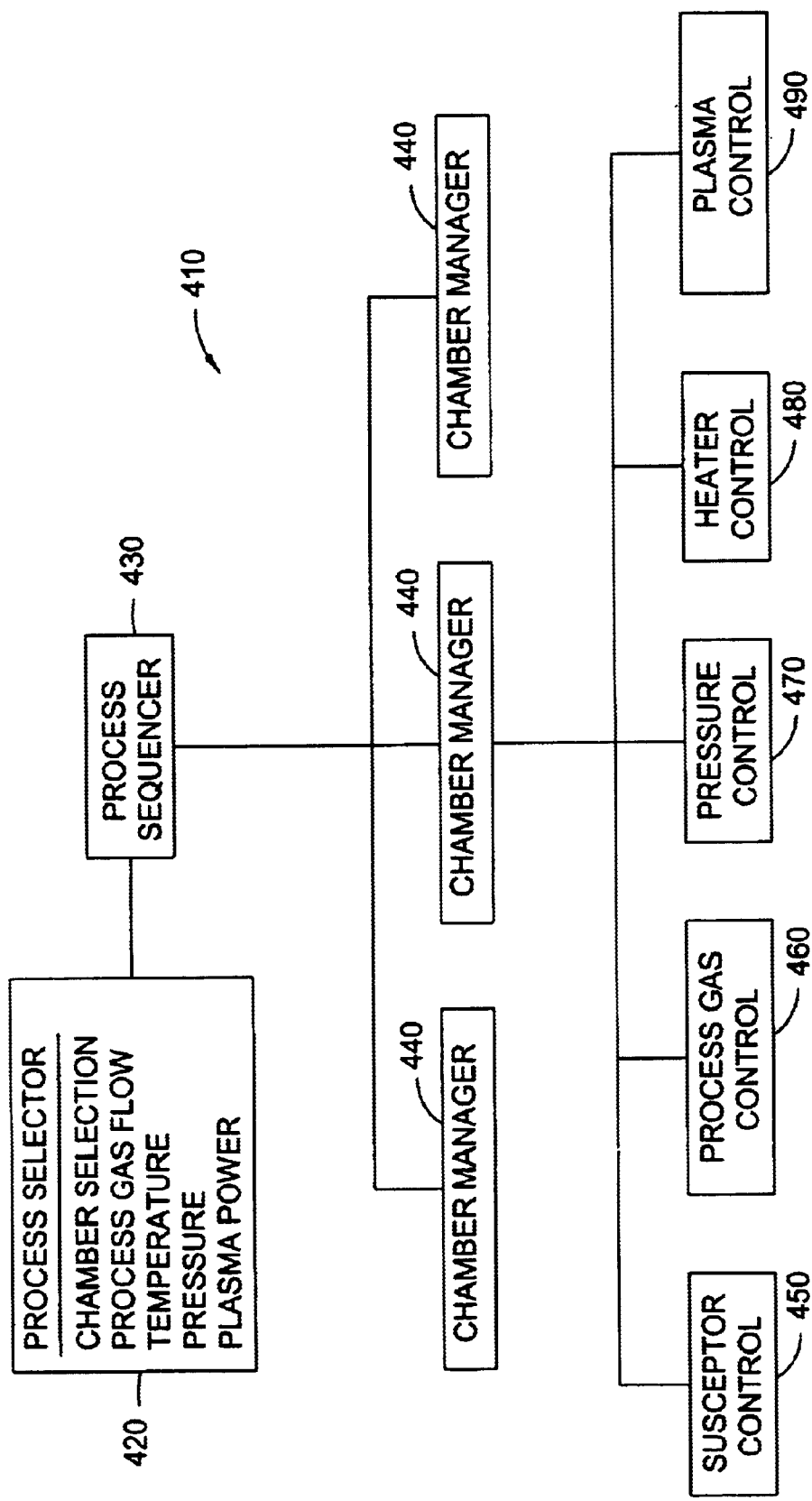
FIG. 8 is a flowchart of a computer program used for process control in conjunction with the exemplary apparatus of FIGS. 1–7.

FIG. 8 shows an illustrative block diagram of the hierarchical control structure of the computer program 400. A user enters a process set number and process chamber number into a process selector subroutine 420 in response to menus or screens displayed on the CRT monitor by using the lightpen interface. The process sets are predetermined sets of process parameters necessary to carry out specified processes, and are identified by predefined set numbers. The process selector subroutine 420 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe.

The signals for monitoring the process are provided by the analog input and digital input boards of the control means 340 and the signals for controlling the process are output on the analog output and digital output boards of the control means 340.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process set numbers and process chamber numbers, so the sequencer subroutine 430 operates to schedule the selected processes in the desired sequence. Preferably the sequencer subroutine 430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such a polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. The chamber manager subroutine 440 controls execution of various chamber component subroutines which control operation of the chamber components necessary to carry out the selected process set including the vaporizer 10, reaction chamber 30, and cold trap. 90. Examples of chamber component subroutines are vaporizer control subroutine 450, process gas control subroutine 460, pressure control subroutine 470, heater control subroutine 480, and dehydrogenation reactor control subroutine 490. Those having ordinary skill in the art would readily recognize that other chamber control subroutines can be included depending on what processes are desired. In operation, the chamber manager subroutine 440 selectively schedules or calls the process components subroutines in accordance with the particular process set being executed. The chamber manager subroutine 440 schedules the process component subroutines similarly to how the process sequencer 430 schedules which process equipment and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber component subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

An inert gas is preferably flowed into the chamber 60 to improve uniformity of the deposited film. For these processes, the process gas control subroutine 460 is programmed to include steps for flowing the inert gas into the chamber 60 for an amount of time necessary to deposit the film. Additionally, when the process gas is to be generated in the vaporizer 10, for p-xylene, the process gas control subroutine 460 can be written to obtain the carrier flow from the vaporizer control subroutine 450.

The pressure control subroutine 470 comprises program code for controlling the pressure in the chamber 60 by regulating the size of the opening of the throttle valve 80 in the exhaust system of the chamber. The size of the opening of the throttle valve 80 is set to control the chamber pressure to the desired level in relation to the total process gas flow, size of the process chamber, and pumping set point pressure for the exhaust system. When the pressure control subroutine 470 is invoked, the desired, or target, pressure level is received as a parameter from the chamber manager subroutine 440. The pressure control subroutine 470 operates to measure the pressure in the chamber 60 by reading one or more conventional pressure manometers connected to the chamber, compare the measure value(s) to the target pressure, obtain PID (proportional, integral, and differential) values from the stored pressure table corresponding to the target pressure, and adjust the throttle valve 80 according to the PID values obtained from the pressure table. Alternatively, the pressure control subroutine 470 can be written to open or close the throttle valve 80 to a particular opening size to regulate the chamber 60 to the desired pressure.

The heater control subroutine 480 comprises program code for controlling the temperature of the chamber 60. The heater control subroutine 480 is invoked by the chamber manager subroutine 440 and receives a target, or set point, temperature parameter. The heater control subroutine 480 measures the temperature by measuring voltage output of thermocouple located in the chamber 60, compares the measured temperature to the set point temperature, and increases or decreases current applied to the lamp module 260 and other heating components to obtain the set point temperatures. The temperature is obtained from the measured voltage by looking up the corresponding temperature in a stored conversion table, or by calculating the temperature using a fourth order polynomial.

The above CVD system description is mainly for illustrative purposes, and other CVD equipment may be employed. Additionally, variations of the above described system such as variations in substrate support design, heater design, location of RF power connections and others are possible.

Deposition of Low k Dielectrics

The copolymers produced by the method and apparatus of the present invention have dielectric constants below about 4.0. The copolymers can replace silicon oxides for many dielectric applications that do not require high oxide content. Copolymers that contain silicon-oxygen bonds can replace silicon oxides in additional applications that are not suited for conventional parylene N layers. Replacement of silicon oxides with the copolymers of the present invention is described below for a blanket deposition application. Persons skilled in the art could readily replace silicon oxides in other applications such as gap filling processes.

A dual damascene structure which includes a parylene copolymer film as the dielectric layer and a silicon oxide, silicon nitride, or hydrogenated silicon carbide etch stop is shown in FIG. 9. A first dielectric layer 510, which is a parylene copolymer of the present invention, is deposited on a substrate 512. An etch stop 514, preferably a silicon oxide deposited from silane, an organosilane, or an organosiloxane, is then deposited on the first dielectric layer and cured. The etch stop is then pattern etched to define the openings of the contacts/vias 516. A second dielectric layer 518, which is the same or a different parylene copolymers as the first dielectric layer 510, is then deposited over the patterned etch stop. The second dielectric layer 58 is then pattern etched by conventional methods to define the interconnect lines 520. A single etch process is then performed to define the interconnects down to the etch stop and to etch the unprotected dielectric exposed by the patterned etch stop to define the contacts/vias.

Figure 10E:
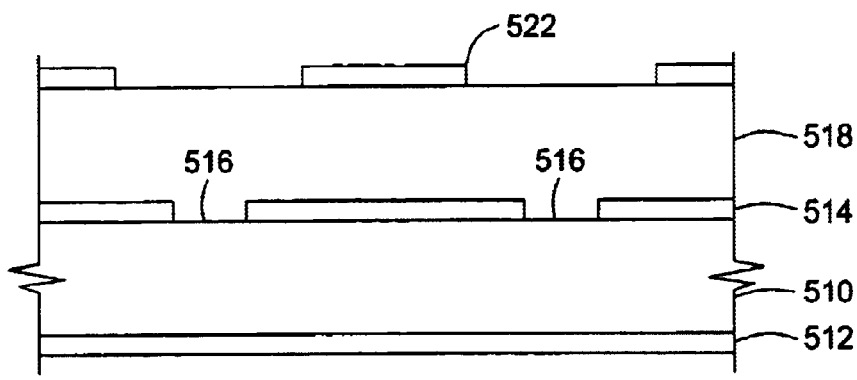
Figure 10F:
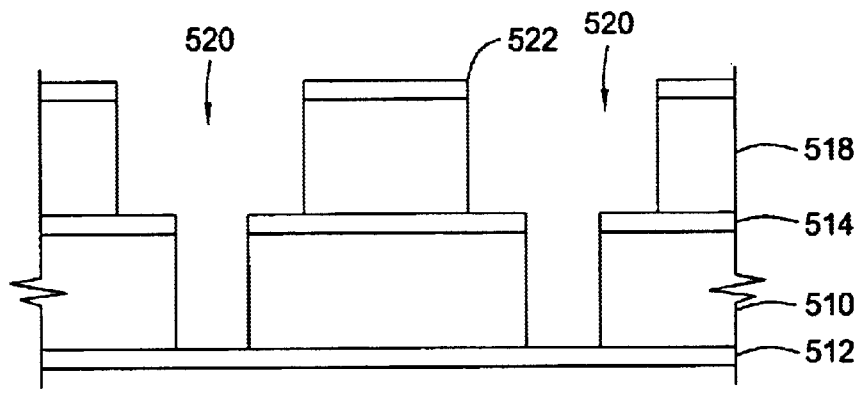
Figure 10G:
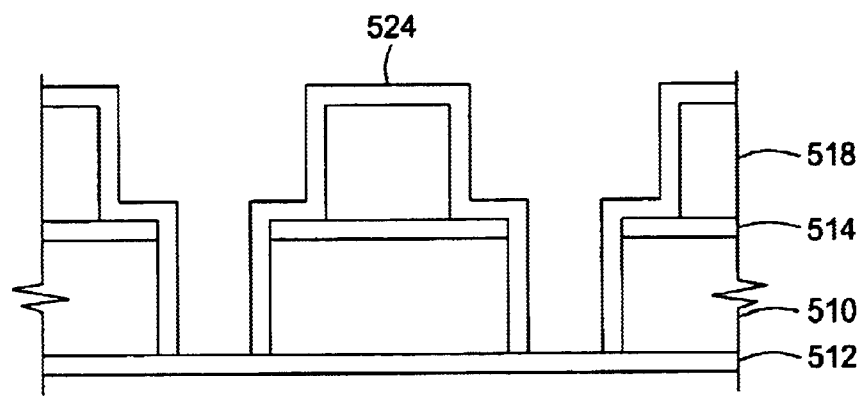
Figure 10H:
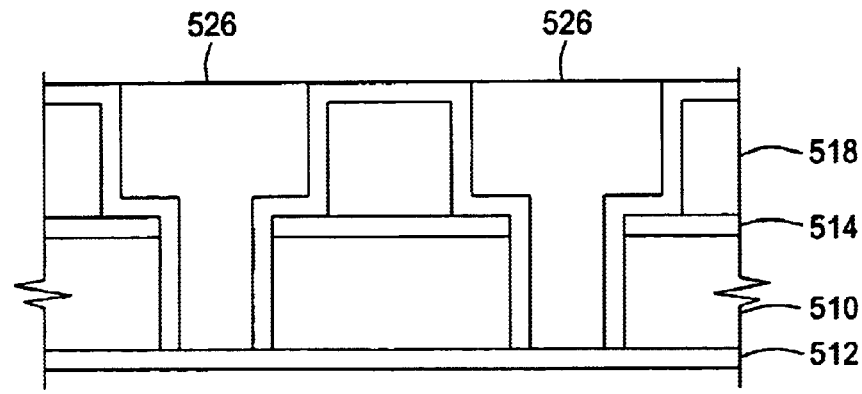

A preferred dual damascene structure fabricated in accordance with the invention includes a lining layer as shown in FIG. 10H, and the method of making the structure is sequentially depicted schematically in FIGS. 10A–10H, which are cross sectional views of a substrate having the steps of the invention formed thereon.

As shown in FIG. 10A, an initial first dielectric layer 510, which is the parylene copolymer, is deposited on the substrate 512 to a thickness of about 5,000 to about 10,000, depending on the size of the structure to be fabricated. As shown in FIG. 10B, the low k etch stop 514, which is an oxidized silane, organosilane, or organosiloxane layer, is then deposited on the first dielectric layer to a thickness of about 200 to about 1000 using low levels of RF power. The low k etch stop 514 is then pattern etched to define the contact/via openings 516 and to expose first dielectric layer 510 in the areas where the contacts/vias are to be formed as shown in FIG. 10C. Preferably, low k etch stop 514 is pattern etched using conventional photolithography and etch processes using fluorine, carbon, and oxygen ions. After low k etch stop 514 has been etched to pattern the contacts/vias and the photo resist has been removed, a second dielectric layer 518 is deposited over etch stop 514 to a thickness of about 5,000 to about 10,000 as shown in FIG. 10D. A second dielectric layer 518 of the parylene copolymer is then patterned to define interconnect lines 520, preferably using conventional photolithography processes with a photo resist layer 522 as shown in FIG. 10E. The interconnects and contacts/vias are then etched using reactive ion etching or other anisotropic etching techniques to define the metallization structure (i.e., the interconnect and contact/via) as shown in FIG. 10F. Any photo resist or other material used to pattern the etch stop 514 or the second dielectric layer 518 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7-cm compared to 3.1-cm for aluminum). Preferably, as shown in FIG. 10G, a suitable barrier layer 524 such as tantalum nitride is first deposited conformally in the metallization pattern to prevent copper migration into the surrounding materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 10H. The invention is further described by the following examples which describe specific embodiments and are not intended to limit the scope of the invention.

Comparison Example 1

Parylene N Polymer

For comparison to the present invention, an eight inch diameter silicon wafer is mounted on a fixed substrate support maintained at a temperature of about 25° C. in a DLK deposition chamber, available from Applied Materials, Inc., of Santa Clara, Calif. The chamber was configured substantially as shown in FIGS. 1 through 8. P-xylylene was provided by sublimation of cyclic di-p-xylylene and decomposition in a thermal reaction chamber 30 which is preheated to a temperature of about 650° C. The exit gate valve 40 of reaction chamber 30 is then opened and the vaporized reactive p-xylylene formed in reactor 30 then flows to the deposition chamber 60 at a rate of about 10 to about 40 sccm. The lid of the deposition chamber 60 is maintained at a temperature of about 150 to about 200° C., and the walls of the chamber 60 are maintained at about 70° C. About 50 sccm of nitrogen and about 25 sccm of backside helium are introduced into the deposition chamber 60 during the deposition and the valve 80 is set to maintain a pressure of 100 mTorr in the deposition chamber.

Deposition was plasma assisted by biasing the gas distribution plate with from about 10W to about 80W of high frequency RF power. The reactive p-xylylene monomer contacts the silicon wafer 200 and polymerizes thereon. After about 2–3 minutes, the flow of reactive monomer vapors is shut off by first shutting the gate valve 20 between the vaporizer 10 and the reactor 30, and then, after purging out the reactor 30 with nitrogen to remove all monomer vapors from that chamber, shutting off the gate valve 40 between the reactor 30 and the deposition chamber 60. The wafer 200 is then removed from the chamber 60.

The deposition rate of the parylene film was about 5,000 to about 20,000 Angstroms per minute. The dielectric constant of the film was tested and found to be from about 2.2 to about 2.5. Thermal stability was measured by thermogravimetric analysis (TGA) at 400° C., and the polymer film exhibited a weight loss of greater than 1%.

Example 2

Tetraallyloxysilane

To further illustrate the process of the invention, an eight inch diameter silicon wafer was mounted on a fixed substrate support maintained at a temperature of about 25° C. in a DLK deposition chamber, available from Applied Materials, Inc., of Santa Clara, Calif. The chamber was configured substantially as shown in FIGS. 1 to 8.

About 30 grams of particulate di-p-xylylene were loaded into the vaporizer 10 and the vaporizer was then heated to about 200° C. The gate valve 20 separating the vaporizer 10 from the decomposition chamber 30 was then opened, and the vapors of dimer were allowed to flow through a mass flow controller into the reaction chamber 30 which was preheated to a temperature of about 850° C. The exit gate valve 40 of the reaction chamber 30 was then opened and the vaporized reactive p-xylylene formed in the reaction chamber 30 then flowed from the reaction chamber through the heated conduit to the deposition chamber 60 at a rate of about 10 sccm. The lid of the deposition chamber 60 was maintained at a temperature of about 150 to about 200° C., and the walls of the chamber 60 were maintained at about 70° C.

Tetraallyloxysilane was introduced into the chamber 60 at a rate of 10 sccm. About 50 sccm of helium and about 25 sccm of nitrogen were flown into the deposition chamber 60 during the deposition and the valve 80 was set to maintain a pressure of 90 mTorr in the deposition chamber. The reactive p-xylylene monomer and comonomer vapors contacted the silicon wafer 200 and copolymerized thereon. Deposition was plasma assisted by biasing the gas distribution plate with from about 5 to about 80W of high frequency RF power. After about 2–3 minutes, the flow of reactive monomer vapors was shut off by first shutting the gate valve 20 between the vaporizer 10 and the reaction chamber 30, and then, after pumping out the reaction chamber 30 to remove all monomer vapors from that chamber, shutting off the gate valve 40 between the reaction chamber and the deposition chamber. The wafer 200 was then removed from the chamber 60 and examined.

The deposition rate of the parylene copolymer film was from about 5,000 to about 20,000 Angstroms per minute. The film is estimated to contain from about 95 wt % to about 99 wt % of polymerized p-xylylene and from about 1 wt % to about 5 wt % of polymerized tetraallyloxysilane. The dielectric constant of the film was tested and found to be from about 2.2 to about 2.5. Thermal stability was substantially improved in comparison to parylene homopolymer as measured by thermogravimetric analysis (TGA) at 400° C., the copolymer film exhibiting less than 1% weight loss in comparison to a typical weight loss of greater than 1% for parylene-N homopolymer films. Presence of silicon/oxygen bonds in the polymer was confirmed by FI-IR. Analysis of remaining carbon-carbon double bonds also establishes that at least 3 of the 4 vinyl groups in the comonomer are polymerized.

Example 3

Tetravinyltetramethylcyclotetrasiloxane

To further illustrate the process of the invention, an eight inch diameter silicon wafer was mounted on a fixed substrate support maintained at a temperature of about 0° C. in a DLK deposition chamber as configured and described in Example 1. About 30 grams of particulate di-p-xylylene were loaded into the vaporizer 10 and the vaporizer was then heated to about 200° C. The gate valve 20 separating the vaporizer 10 from the reaction chamber 30 was then opened, and the vapors of dimer were allowed to flow through a mass flow controller into the reaction chamber 30 which was preheated to a temperature of about 850° C. The exit gate valve 40 of the reaction chamber 30 was then opened and the vaporized reactive p-xylylene formed in the reaction chamber 30 then flowed from the reaction chamber through the heated conduit to the deposition chamber 60 at a rate of about 10 sccm. The lid of the deposition chamber 60 was maintained at a temperature of from about 150 to about 200° C., and the walls of the chamber 60 were maintained at about 70° C.

Tetravinyltetramethylcyclotetrasiloxane was introduced into the chamber 60 at a rate of about 30 sccm. About 50 sccm of nitrogen and about 25 sccm of backside helium was flown into the chamber 60 during the deposition and the valve 80 was set to maintain a pressure of about 160 mTorr in the deposition chamber. Deposition was plasma assisted by biasing the gas distribution plate with from about 10 to about 40W of high frequency RF power. The reactive p-xylylene monomer and comonomer vapors contacted the silicon wafer 200 and copolymerized thereon. After about 2–3 minutes, the flow of reactive monomer vapors was shut off by first shutting the gate valve 20 between the vaporizer 10 and the reaction chamber 30, and then, after pumping out the reaction chamber 30 to remove all monomer vapors from that chamber, shutting off the gate valve 40 between the reaction chamber and the deposition chamber. The wafer 200 was then removed from the chamber 60 and examined.

The deposition rate of the parylene copolymer film was from about 5,000 to about 20,000 Angstroms per minute. The film is estimated to contain about 90 to about 99 wt % of polymerized p-xylylene and about 1 to about 10 wt % of polymerized comonomer. The dielectric constant of the film was tested and found to be from about 2.2 to about 2.5. Thermal stability was substantially improved in comparison to parylene homopolymer as measured by TGA at 400° C., the copolymer film exhibiting less than 1% weight loss in comparison to a typical weight loss of greater than 1% for parylene-N homopolymer film. Presence of silicon/oxygen bonds in the polymer was confirmed by FI-IR. Analysis of remaining carbon-carbon double bonds also establishes that at least 3 of the 4 vinyl groups in the comonomer are polymerized.

Example 4

Trivinylmethylsilane Copolymer

To further illustrate the process of the invention, an eight inch diameter silicon wafer is mounted on a fixed substrate support maintained at a temperature of about 25° C. in a DLK deposition chamber, available from Applied Materials, Inc., of Santa Clara, Calif. The chamber was configured substantially as shown in FIGS. 1 through 8. P-xylylene was provided by sublimation of di-p-xylylene and decomposition in a thermal reaction chamber 30 which is preheated to a temperature of about 650° C. The exit gate valve 40 of reaction chamber 30 is then opened and the vaporized reactive p-xylylene formed in reactor 30 then flows to the deposition chamber 60 at a rate of about 40 sccm. The lid of the deposition chamber 60 is maintained at a temperature of about 150 to about 200° C., and the walls of the chamber 60 are maintained at about 70° C.

Trivinylmethylsilane is introduced into the chamber 60 at a rate of 10 sccm. About 50 sccm of nitrogen and about 25 sccm of backside helium are introduced into the deposition chamber 60 during the deposition and the valve 80 is set to maintain a pressure of 100 mTorr in the deposition chamber. Deposition was plasma assisted by biasing the gas distribution plate with from about 10 to about 40W of high frequency RF power. The reactive p-xylylene monomer and comonomer vapors contact the silicon wafer 200 and copolymerize thereon. After about 2–3 minutes, the flow of reactive monomer vapors is shut off by first shutting the gate valve 20 between the vaporizer 10 and the reactor 30, and then, after purging out the reactor 30 with nitrogen to remove all monomer vapors from that chamber, shutting off the gate valve 40 between the reactor 30 and the deposition chamber 60. The wafer 200 is then removed from the chamber 60.

The deposition rate of the parylene copolymer film was from about 5,000 to about 20,000 Angstroms per minute. The film is estimated to contain about 90 to about 95 wt % of polymerized p-xylylene and about 5 to about 10 wt % of polymerized comonomer. The dielectric constant of the film was tested and found to be from about 2.4 to about 2.6. Thermal stability was substantially improved in comparison to parylene homopolymer as measured by TGA at 400° C., the copolymer film exhibiting less than 1% weight loss in comparison to a typical weight loss of greater than 1% for parylene-N homopolymer film. Analysis of remaining carbon-carbon double bonds establishes that at least 2 of the 3 vinyl groups in the comonomer are polymerized.

Example 5

Tetraallyloxysilane, no RF Power

To further illustrate the process of the invention, an eight inch diameter silicon wafer was mounted on a fixed substrate support maintained at a temperature of about 25° C. in a DLK deposition chamber, available from Applied Materials, Inc., of Santa Clara, Calif. The chamber was configured substantially as shown in FIGS. 1 through 8.

About 30 grams of particulate di-p-xylylene were loaded into the vaporizer 10 and the vaporizer was then heated to about 200° C. The gate valve 20 separating the vaporizer 10 from the reaction chamber 30 was then opened, and the vapors of dimer were allowed to flow through a mass flow controller into the reaction chamber 30 which was preheated to a temperature of about 850° C. The exit gate valve 40 of the reaction chamber 30 was then opened and the vaporized reactive p-xylylene formed in the reaction chamber 30 then flowed from the reaction chamber through the heated conduit to the deposition chamber 60 at a rate of about 10 sccm. The lid of the deposition chamber 60 was maintained at a temperature of about 150° C., and the walls of the chamber 60 were maintained at about 100° C.

Tetraallyloxysilane was flown into the chamber 60 at a rate of 10 sccm. About 50 sccm of nitrogen and about 25 sccm of backside helium were flown into the deposition chamber 60 during the deposition and the valve 80 was set to maintain a pressure of 90 mTorr in the deposition chamber. The reactive p-xylylene monomer and comonomer vapors contacted the silicon wafer 200 and copolymerized thereon. After about 2–3 minutes, the flow of reactive monomer vapors was shut off by first shutting the gate valve 20 between the vaporizer 10 and the reaction chamber 30, and then, after pumping out the reaction chamber 30 to remove all monomer vapors from that chamber shutting off the gate valve 40 between the reaction chamber and the deposition chamber. The wafer 200 was then removed from the chamber 60 and examined.

The deposition rate of the parylene copolymer film was about 5000 Angstroms per minute. The film is estimated to contain about 95 wt % of polymerized p-xylylene and about 5 wt % of polymerized tetraallyloxysilane. The dielectric constant of the film was tested and found to be about 2.19. Thermal stability was substantially improved in comparison to parylene homopolymer as measured by thermogravimetric analysis (TGA) at 400° C., the copolymer film exhibiting less than 1% weight loss in comparison to a typical weight loss of greater than 1% for parylene-N homopolymer films. Presence of silicon/oxygen bonds in the polymer was confirmed by FI-IR. Analysis of remaining carbon-carbon double bonds also establishes that at least 3 of the 4 vinyl groups in the comonomer are polymerized.

Example 6

Tetravinyltetramethylcyclotetrasiloxane, no RF Power

To further illustrate the process of the invention, an eight inch diameter silicon wafer was mounted on a fixed substrate support maintained at a temperature of about 0° C. in a DLK deposition chamber as configured and described in Example 1. About 30 grams of particulate di-p-xylylene were loaded into the vaporizer 10 and the vaporizer was then heated to about 200° C. The gate valve 20 separating the vaporizer 10 from the reaction chamber 30 was then opened, and the vapors of dimer were allowed to flow through a mass flow controller into the reaction chamber 30 which was preheated to a temperature of about 850° C. The exit gate valve 40 of the reaction chamber 30 was then opened and the vaporized reactive p-xylylene formed in the reaction chamber 30 then flowed from the reaction chamber through the heated conduit to the deposition chamber 60 at a rate of about 10 sccm. The lid of the deposition chamber 60 was maintained at a temperature of about 150° C., and the walls of the chamber 60 were maintained at about 100° C.

Tetravinyltetramethylcyclotetrasiloxane was flown into the chamber 60 at a rate of about 30 sccm. About 50 sccm of nitrogen and about 25 sccm of backside helium was flown into the chamber 60 during the deposition and the valve 80 was set to maintain a pressure of about 160 mTorr in the deposition chamber. The reactive p-xylylene monomer and comonomer vapors contacted the silicon wafer 200 and copolymerize thereon. After about 2–3 minutes, the flow of reactive monomer vapors was shut off by first shutting the gate valve 20 between the vaporizer 10 and the reaction chamber 30, and then, after pumping out the reaction chamber 30 to remove all monomer vapors from that chamber, shutting off the gate valve 40 between the reaction chamber and the deposition chamber. The wafer 200 was then removed from the chamber 60 and examined.

The deposition rate of the parylene copolymer film was about 2500 Angstroms per minute. The film is estimated to contain about 90 to 97 wt % of polymerized p-xylylene and about 3 to 10 wt % of polymerized comonomer. The dielectric constant of the film was tested and found to be about 2.39. Thermal stability was substantially improved in comparison to parylene homopolymer as measured by TGA at 400° C., the copolymer film exhibiting less than 1% weight loss in comparison to a typical weight loss of greater than 1% for parylene-N homopolymer film. Presence of silicon/oxygen bonds in the polymer was confirmed by FI-IR. Analysis of remaining carbon-carbon double bonds also establishes that at least 3 of the 4 vinyl groups in the comonomer are polymerized.

While the foregoing is directed to the preferred embodiment of the present invention, other and further embodiments of the invention may be devised without departing from the basic scope thereof. The scope of the invention is determined by the claims which follow.

What is claimed is:

1. A process for depositing a copolymer material, comprising:

activating p-xylylene, or a derivative thereof, and a comonomer having at least two carbon-carbon double bonds and at least one Si—O bond, at a constant RF power level from about 10W to about 80W;

condensing the p-xylylene and the comonomer on a substrate; and polymerizing a copolymer layer on the substrate, wherein the copolymer layer comprises at least 1% by weight of polymerized comonomer.

2. The process of claim 1, wherein the comonomer is selected from a group consisting of tetravinyltetramethylcyclotetrasiloxane, tetraallyloxysilane, and combinations thereof.

3. The process of claim 1, wherein the polymerized copolymer has a dielectric constant less than about 2.5.

4. The process of claim 1, wherein the polymerized copolymer is amorphous.

5. The process of claim 1, wherein the polymerized copolymer comprises less than about 15 wt % of the comonomer.

* * * * *